(12) United States Patent
Fiteri et al.

(10) Patent No.: US 10,825,974 B2
(45) Date of Patent: Nov. 3, 2020

(54) LIGHT-EMITTING DIODE PACKAGE AND METHOD OF MANUFACTURE

(71) Applicant: PLESSEY SEMICONDUCTORS LIMITED, Plymouth (GB)

(72) Inventors: Zainul Fiteri, Roborough (GB); Keith Strickland, Roborough (GB)

(73) Assignee: Plessey Semiconductors Limited, Plymouth (GB)

( * ) Notice: Subject to any disclaimer, the term of this patent is extended or adjusted under 35 U.S.C. 154(b) by 0 days.

(21) Appl. No.: 16/307,429

(22) PCT Filed: Jun. 6, 2017

(86) PCT No.: PCT/GB2017/051634
§ 371 (c)(1),
(2) Date: Dec. 5, 2018

(87) PCT Pub. No.: WO2017/212247
PCT Pub. Date: Dec. 14, 2017

(65) Prior Publication Data
US 2019/0088843 A1    Mar. 21, 2019

(30) Foreign Application Priority Data

Jun. 7, 2016  (GB) .................................. 1609939.2
Jun. 7, 2016  (GB) .................................. 1609941.8

(51) Int. Cl.
*H01L 33/62*    (2010.01)
*H01L 33/10*    (2010.01)
(Continued)

(52) U.S. Cl.
CPC ............ *H01L 33/62* (2013.01); *H01L 33/007* (2013.01); *H01L 33/10* (2013.01); *H01L 33/32* (2013.01);
(Continued)

(58) Field of Classification Search
None
See application file for complete search history.

(56) References Cited

U.S. PATENT DOCUMENTS 5,701,033 A    12/1997  Ueda et al.
5,831,825 A    11/1998  Fromont
(Continued)

FOREIGN PATENT DOCUMENTS

JP    H09199629    7/1997

OTHER PUBLICATIONS

International Search Report and Written Opinion, PCT/GB2017/051634, dated Aug. 9, 2017, 16 pages.
(Continued)

*Primary Examiner* — Minh Loan Tran
(74) *Attorney, Agent, or Firm* — Stinson LLP

(57) ABSTRACT

An LED package for connection to a heat sink, the LED package comprising an LED structure having a first surface for emitting light and an opposite second surface, the LED structure comprising a light producing layer and a reflective layer, wherein the reflective layer is provided between the light producing layer and the second surface, whereby light is reflected by the reflective layer to the first surface, the first surface further comprising first and second electrical contacts. A frame overlaps the periphery of the first surface of the LED structure and has an aperture for emitting light from the first surface, the frame comprising first and second vias for connection to an external electrical circuit, the first and second vias are soldered to the first and second electrical contacts of the LED structure respectively.

11 Claims, 8 Drawing Sheets

(51) Int. Cl.

| | | |
|---|---|---|
| *H01L 33/60* | (2010.01) | |
| *H01L 33/64* | (2010.01) | |
| *H01L 33/00* | (2010.01) | |
| *H01L 33/32* | (2010.01) | |
| *H01L 33/50* | (2010.01) | |
| *H01L 33/48* | (2010.01) | |
| *H01L 33/58* | (2010.01) | |
| *H01L 33/46* | (2010.01) | |

(52) U.S. Cl.
CPC .......... *H01L 33/483* (2013.01); *H01L 33/486* (2013.01); *H01L 33/502* (2013.01); *H01L 33/58* (2013.01); *H01L 33/60* (2013.01); *H01L 33/64* (2013.01); *H01L 33/642* (2013.01); *H01L 33/46* (2013.01); *H01L 33/505* (2013.01); *H01L 2933/005* (2013.01); *H01L 2933/0033* (2013.01); *H01L 2933/0058* (2013.01); *H01L 2933/0066* (2013.01); *H01L 2933/0075* (2013.01)

(56) References Cited

U.S. PATENT DOCUMENTS

| | | | |
|---|---|---|---|
| 6,483,186 | B1 | 11/2002 | Hsieh et al. |
| 8,564,114 | B1 | 10/2013 | Lanzone |
| 2005/0017258 | A1 | 1/2005 | Fehrer et al. |
| 2008/0038912 | A1 | 2/2008 | Hess et al. |
| 2010/0038670 | A1 | 2/2010 | Paneccione et al. |
| 2010/0055845 | A1 | 3/2010 | Ikawa et al. |
| 2010/0290193 | A1 | 11/2010 | Liu et al. |
| 2012/0037935 | A1 | 2/2012 | Yang |
| 2012/0104421 | A1* | 5/2012 | Wai .......... H01L 24/97 257/88 |
| 2013/0069218 | A1 | 3/2013 | Seah |
| 2013/0270592 | A1* | 10/2013 | Reiherzer .......... H01L 33/52 257/98 |
| 2014/0042479 | A1 | 2/2014 | Margalit |
| 2014/0045286 | A1 | 2/2014 | Yoo et al. |
| 2016/0276545 | A1 | 9/2016 | Mueller et al. |

OTHER PUBLICATIONS

Great Britain Search Report, GB Application No. 1609941.8, 6 pages.

Great Britain Search Report, GB Application No. 1609939.2, 6 pages.

* cited by examiner

US 10,825,974 B2

LIGHT-EMITTING DIODE PACKAGE AND METHOD OF MANUFACTURE

REFERENCE TO RELATED APPLICATIONS

This application is a US national stage application based on PCT/GB2017/051634 filed Jun. 6, 2017, and claims priority to GB 1609941.8 filed Jun. 7, 2016 and GB 1609939.2 filed Jun. 7, 2016, the entire disclosures of which are expressly incorporated herein by reference.

FIELD OF THE INVENTION

This disclosure relates to a light-emitting diode package, in particular to a simplified light-emitting diode package with reduced thermal resistance, and a method of manufacture of the same. Additionally, this disclosure relates to a package for a power device, in particular to a simplified package, and a method of manufacture of the same.

BACKGROUND OF THE INVENTION

Light emitting diode (LED) chips emit a wide angular beam of light either from only a single top surface or from a plurality of surfaces. This results in a full beam angle which is at least 180 degrees wide. Since LEDs commonly emit a narrow spectrum of light it is necessary to use phosphor materials to convert the light emitted from the LED chip into a broader spectrum and higher wavelength (white light for instance).

For a number of lighting applications there is a requirement for high power LED chips. Such high power LED chips suffer from heating issues. Degradation of components due to repeated heat cycling and damage to components due to overheating may lead to restriction of the functional life of an LED chip. Inefficient heat management will lead to LED chips operating at higher temperatures where the efficiency of the light generation from the LED is lower.

Conventional light emitting diodes allow heat dissipation through the surface area that is opposite to the top light-emitting surface area of the chip. The quantum wells layer where the heat is generated is separated from the heat dissipation area by a relatively thick carrier substrate (70 µm to 350 µm). As a result the thermal resistance of the LED chip is undesirably high. This problem is compounded by the need for multiple further layers between the LED chip and the heatsink normally contained within the device. In addition, this is a particular problem for certain substrates, such as sapphire, which have a low heat conductance.

In a conventional packaging the chip is attached to a substrate in the device using an epoxy or solder adhesive. In conventional chip-on-board applications the chip is generally separated from the heat sink by an epoxy/solder adhesive, a substrate, solder, a printed circuit board and a layer of thermal interface material. This thermal stack increases the thermal resistance of the LED package leading to overheating of the LED chip.

In conventional devices the LED chip and packaging are interconnected by wire bonding. In particular, conventional lateral and vertical LED chips all use one or more bond wires for connection. This requires many individual metal wires, generally gold, silver, copper, or aluminium, to be attached to both the LED chip and packaging. This process requires precision to accurately bond the materials. Additionally, there are well known drawbacks associated with the common materials and techniques used.

Copper wire is the preferred materials due to its relative cost and its favourable, low electrical resistance. However, it is harder than both gold and aluminium, restricting bonding parameters, and oxides are inherently formed leading to shelf life issues.

Bond wires and pads can also block a portion of the light emitting surface, reducing the amount of light being emitted. For high power devices where the current consumption is high (Amps) the number of bond wires required to carry the current is increased. This exacerbates the light blocking by the additional bond wires and increasing bond pad area which would have to increase to accommodate the greater number of bonds.

US 2012/0037935 discloses a substrate for LED packaging and a fabrication method thereof.

SUMMARY OF THE INVENTION

Accordingly, it is desirable to provide an improved LED package and method of manufacture and/or tackle at least some of the problems associated with the prior art or, at least, to provide a commercially useful alternative thereto.

In a first aspect the present disclosure provides an LED package for connection to a heat sink, the LED package comprising:

an LED structure having a first surface for emitting light and an opposite second surface, the LED structure comprising a light producing layer and a reflective layer, wherein the reflective layer is provided between the light producing layer and the second surface, whereby light is reflected by the reflective layer to the first surface, the first surface further comprising first and second electrical contacts; and a frame overlapping the periphery of the first surface of the LED structure and having an aperture for emitting light from the first surface, the frame comprising first and second vias for connection to an external electrical circuit, the first and second vias soldered to the first and second electrical contacts of the LED structure respectively.

DETAILED DESCRIPTION OF PREFERRED EMBODIMENTS

Figure 1:
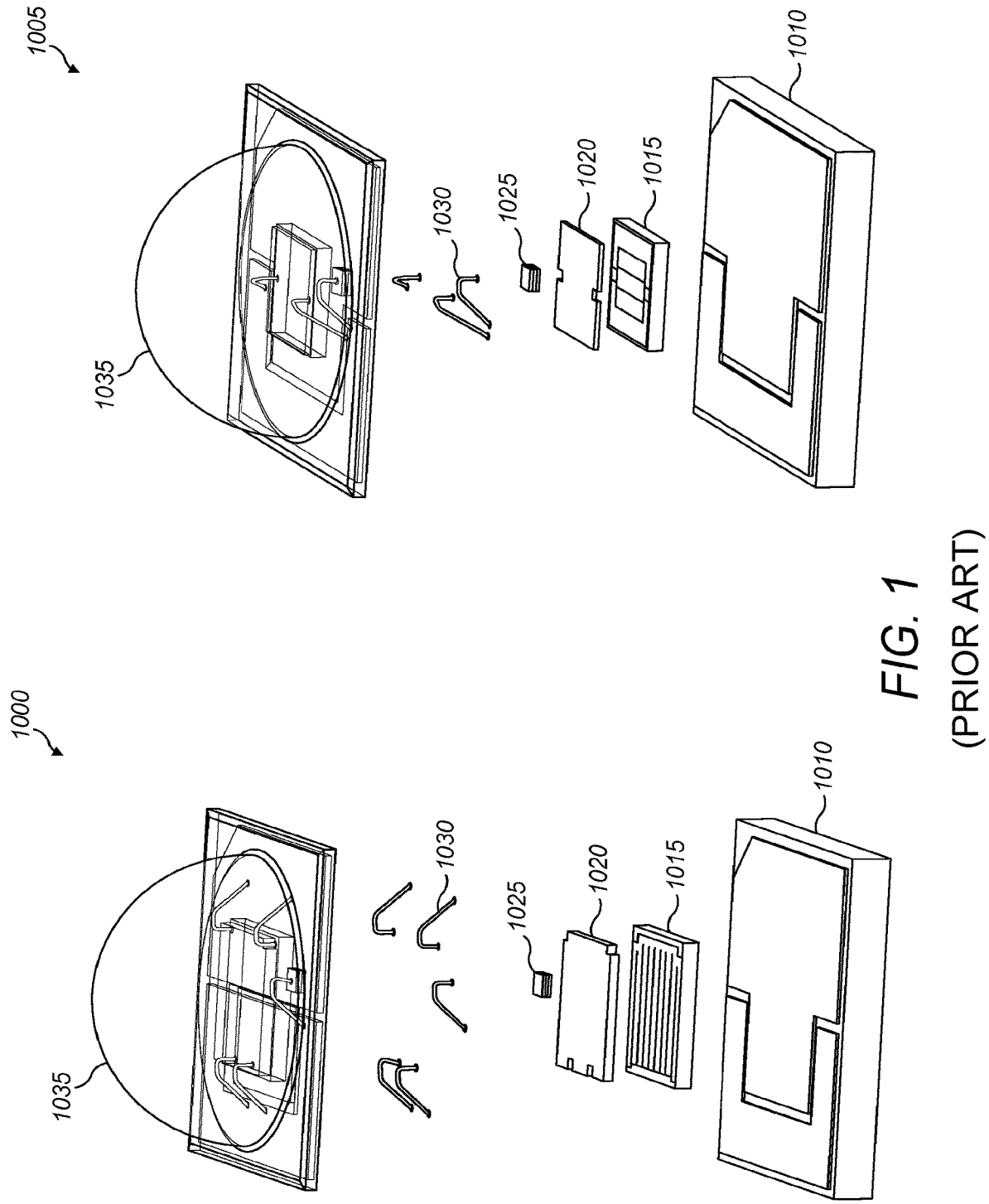
FIG. 1 shows two different conventional vertical LED packages.

The present invention will now be further described. In the following passages different aspects of the invention are defined in more detail. Each aspect so defined may be combined with any other aspect or aspects unless clearly indicated to the contrary. In particular, any feature indicated as being preferred or advantageous may be combined with any other feature or features indicated as being preferred or advantageous.

The following description uses the term light-emitting diode (LED) structure to refer to the semiconductor structure which produces and emits light when electrical contacts are present and a potential difference is applied. The LED structure, therefore, typically comprises at least a p-type and an n-type layer sandwiched together, preferably with a layer comprising multiple quantum wells sandwiched therebetween.

The term "light-emitting diode structure" may also include further aspects required to permit the generation of light as desired when a potential difference is applied. Therefore, the term includes for example, electrodes, supporting substrates, passivation layers and any added phosphors and transparent material layers. When including these further aspects the LED structure may be referred to as an LED chip.

The term "light-emitting diode package" is used to refer to the device including the light-emitting diode chip, together with the requisite electrical connections and any protective coating required to permit the device to be used in an electrical device or, for example, soldered to a PCB.

The term "surface" when used in reference to a lateral LED structure or chip refers to the generally planar portions of the chip perpendicular to the direction of the layers. The term side when used in reference to a lateral LED structure or chip refers to those faces of the structure or chip on which the layered structure is exposed.

An LED chip may comprise multiple LED structures and may be divided into a plurality of smaller chips before these are included into an LED device. Alternatively an LED chip may comprise multiple LED structures which can be separately connectable and separately addressable when included in a single LED device.

The LED package as described herein does not contain any bond wires and allows direct connection to a heat sink, improving light emission levels and heat dissipation which may improve LED life expectancy, respectively. The package is for connection to a heat-sink, preferably a chip-direct connection, preferably using a thermal interface material.

Preferably, the package of the present invention does not contain any bond wires or redistribution layers or equivalent structures. That is, the chip is connected directly to the package of the present invention without the need for additional electrical connections.

The term "via" as used herein broadly covers any electrical pathway, wiring or electrical connection within the frame. For example, a via connects one surface of the frame to another, or first and second portions of the same surface. The via will typically include a first solder pad for connection to an electrical contact of the LED structure and a second, remote solder pad for connection to an external circuit.

In particular, the inventors have found that the LED package is particularly advantageous because it is simpler and cheaper to produce due to the elimination of the wire bonding steps. Additionally, the elimination of the bond wires improves light emission since in conventional LED packages the bond wires block a portion of the light emitted by the LED, and enables the LED package to be driven at higher current levels.

The LED structure of the present invention has a first surface for emitting light, an opposite second surface, and a light producing layer between the two surfaces. The structure further comprises a reflective layer between the light producing layer and the second surface, whereby light is reflected by the reflective layer to the first surface.

Light produced in the light producing layer may leave the light producing layer in any direction. Light moving from the light producing layer towards the first surface is desired, since this light is emitted from the first surface. Light moving from the light producing layer towards the second surface is reflected by the reflective layer back to the first surface. Without the reflective layer, light which moves towards the second surface may be absorbed by various components of the device containing the LED structure/package. Such light is lost to heating the component which absorbs it, and does not add to the light emitted by the device. Such light therefore reduces the efficiency of the LED. Additionally, light absorbed by components of the device may increase the heating of the LED. Accordingly, the reflective layer may improve the efficiency of the LED.

The frame of the present invention overlaps the periphery of the first surface of the LED structure. The frame may overlap the entirety of the periphery of the first surface. Preferably the frame overlaps less than 10% of the area of the first surface, more preferably less than 5%, most preferably less than 1%. That is, the frame aperture allows light emitted from the majority of the first surface of the LED structure to be emitted as useful light from the LED package. The frame is preferably arranged to overlap to the solder pad of the chip on the first surface without blocking the light emitting area, such that a minimum 99% of emitting area is exposed through the aperture.

Preferably the frame does not overlap the second surface. That is, preferably the second surface of the LED structure is exposed, preferably the second surface is completely exposed.

Preferably the package of the present invention does not contain any thermal vias. Advantageously, the package of the present invention allows for direct bonding of the second surface of the chip to a heat sink, eliminating the need for thermal vias. Thermal vias are common in conventional LED packages. Where electrical vias are present to provide a path for electrical flow through a package, thermal vias are present to provide a path for heat flow through a package.

The frame of the present invention may be formed of any suitable, electrically insulating material. The frame contains two electrically isolated vias for connecting to the first and second contacts of the LED structure. The vias are connectable at a first end to the LED structure and at a second remote end to an electrical circuit, such as by solder connections.

The first and second contacts of the LED structure may be soldered to the first and second vias of the frame respectively to form an efficient electrical connection. That is, preferably the LED structure is attached to the package by the first surface. Preferably, the second surface is not attached to the frame.

The present inventors have found that the frame can be made of any material through which an electrical circuit can be formed, such as ceramics, PCB, flex circuit and Through Silicon Via (TSV) materials. Ceramic frames are particularly suitable. Such materials may be precisely shaped and offer advantageously high electrical resistance whilst being light and relatively low cost.

The LED structure of the present invention may be a vertical or lateral LED structure. Such LED structures are well known in the art. Preferably the LED structure is a lateral LED structure. The LED structure of the present invention may comprise a light producing layer between p-doped and n-doped layers supported by a substrate.

The substrate can be any conventional substrate for forming a semiconductor wafer. Suitable substrates include sapphire and SiC, as well as any silicon containing substrate. Preferably the substrate consists essentially of silicon and unavoidable impurities. The use of silicon substrates is especially cost effective but using conventional structures can lead to high levels of defects. Silicon is also preferred as the substrate material since it has high thermal conductivity. The silicon substrate preferably forms the second surface.

The substrate can alternatively consist of SiC which has the highest thermal conductivity compared to sapphire and silicon. This permits particularly high heat dissipation to a heat sink which is particularly advantageous in high power devices.

Preferably the p- and n-doped layers comprise doped GaN.

Preferably the p-doped and n-doped layers are grown on a compositionally graded AlGaN layer by metal-organic vapour phase epitaxy. This improves the structure of the doped layers as it minimises the mismatch in lattice parameters and thermal expansion coefficients between the doped layers and the substrate layer.

Preferably the light producing layer comprises a multiple quantum wells layer, preferably an InGaN—GaN layer.

As used herein, any reference to a species by its constituent components includes all available stoichiometries thereof. Thus, for example, AlGaN includes all alloys thereof, such as $Al_xGa_{(1-x)}N$ wherein x does not equal 1 or 0. Preferred stoichiometries will vary depending on the thickness of the layer required.

In certain designs of LED structure, the light emitting layers may be bonded to a substrate, such as silicon, with a reflective adhesive. This provides good thermal conduct and an integrated reflective layer within the structure, where the reflective layer is between the light-producing layer and the second surface.

The package may be directly bonded to a heat sink by a layer of thermal interface material between the substrate and the heat sink. Preferably the heat-sink comprises copper and/or aluminium. That is, preferably the package is directly bonded to a heat sink by a layer of thermal interface material between the second surface of the LED structure.

Preferably the thermal interface material is a thermal interface grease, a thermal interface tape or a thermal interface compound. Thermal interface materials are well known in the art. Additionally, thermal interface materials comprising graphene sheet, carbon nanotube arrays and nanoparticles may be suitable for use in bonding the package to the heat sink (see for example US 20170005026).

The LED package of the present invention may have a thermal resistance of less than 5° C./W, preferably less than 3° C./W, more preferably less than 1.6° C./W and most preferably less than 0.7° C./W. This resistance is so low because the use of the frame permits the direct contact of the LED structure with a heat sink for heat release to the ambient environment.

That is, the frame of the present invention does not cover or overlap the second surface of the LED structure and preferably the package is directly attached to the heat sink via the exposed second surface of the LED structure. As discussed above, minimising the number of layers (thermal stack) between the LED structure and the heat sink improves heat release from the LED structure.

The thermal resistance of the LED package can be measured using a thermocouple. The package format means that performance is measured based on the chip's contact area and therefore thermal resistance should be based on the chip size.

The expected thermal resistance can also be calculated as follows:

E.g. Silicon (k=149 W/mK) chip bottom contact is 1.4× 1.4 mm, thickness of 0.2 mm $$R_{th}=L/(k \times A)=0.68° C./W$$

(L=chip thickness, k=thermal conductivity of chip substrate, A=chip contact area)

The same applies for multiple chips where the distributed area is larger and thus achieves a much lower thermal resistance.

Preferably the LED package further comprises a wavelength conversion material on the first surface of the LED structure and bounded by the frame aperture, preferably wherein the wavelength conversion material substantially fills the frame aperture.

The wavelength conversion material may be dispensed or sprayed onto the first surface or may be a tape or screen print applied to the first surface of the LED structure.

The wavelength conversion material may be a phosphor, or a component selected from silicates, a garnet, a sulfide or quantum dot, or a combination thereof. The provision of these materials into the aperture is advantageous because a reduced volume of the material is required because the dam formed by the frame retains only the amount of material needed.

The use of a phosphor is the most preferred wavelength conversion material.

Preferably the LED package further comprises a lens for focussing light emitted from the structure. Advantageously the frame of the LED package provides a substantially flat surface onto which a lens may be formed or attached. The frame may allow 'clip' or 'snap' on lens to be accurately and reliably attached to the LED package.

The frame may comprise an upper and a lower layer. The upper layer may be adjacent to and overlap the periphery of the first surface of the LED structure. The lower layer may substantially surround the second surface of the led structure without overlapping it. The inventors have found that using an LED structure with chamfered edges is particularly preferable for accurately and securely housing the LED structure.

The present inventors have found that the LED package of the present invention has improved thermal resistance with respect to conventional LED packages. The LED package of the present invention may be bonded directly to a heatsink increasing heat dissipation from the package.

A heatsink is a passive heat exchanger that transfers the heat generated by an electronic or a mechanical device to a fluid medium, often air or a liquid coolant, where it is dissipated away from the device, thereby allowing regulation of the device's temperature at optimal levels. The heatsink is not an electrically active portion of a device or system. Preferred heatsinks include copper and/or aluminium. Copper is used because it has many desirable properties for thermally efficient and durable heat exchangers. First and foremost, copper is an excellent conductor of heat. This means that copper's high thermal conductivity allows heat to pass through it quickly. Aluminium is used in applications where weight is a big concern The bonding of the package to the heatsink may use a thermal interface material as an adhesive. Thermal adhesive or thermal grease improve the heat sink's performance by filling air gaps between the heat sink and the heat spreader on the device. Preferred compounds include thermal interface materials comprising nanoparticles which improve the thermal conductance.

Nominally flat surfaces of heat sinks and electrical components may appear rough at a microscopic level. This means that there are air gaps between the surfaces that have a high thermal resistance. Thermal interface materials such as greases and conductive particle-filled epoxies have been developed to address this problem. More recently, carbon nanotube arrays (CNTs) have been developed as a more efficient TIM. Current research has also incorporated nanoparticles in thermal interface materials as they offer improved (low) thermal interface resistance in addition to the bulk conductivity of many known materials.

In another aspect the present disclosure provides a method for the manufacture of an LED package, the method comprising:

providing an LED structure having a first surface for emitting light and an opposite second surface, the LED structure comprising a light producing layer and a reflective layer, wherein the reflective layer is provided between the light producing layer and the second surface, whereby light is reflected by the reflective layer to the first surface, the first surface further comprising first and second electrical contacts;

providing a frame having an aperture and, on one face, a recess for receiving the LED structure, the frame comprising first and second vias for connection to an external electrical circuit;

introducing the LED structure into the frame, whereby the frame overlaps the periphery of the first surface of the LED structure and provides an aperture for emitting light from the first surface, and whereby the first and second vias align with the first and second contacts of the LED structure respectively;

connecting the first and second vias to the first and second contacts respectively.

The method of the present invention is suitable for producing the LED package of the present disclosure.

Preferably, after the LED structure is introduced into the recess, bonding material is filled into the recess, around the LED structure, to retain the LED structure in the recess.

Preferably the LED structure has one or more chamfered sides to thereby aid retention by the bonding material.

There is also described herein a semiconductor device comprising:

a semiconductor structure having a first surface and an opposite second surface, the semiconductor structure comprising a plurality of semiconductor layers, the first surface further comprising first and second electrical contacts;

a frame having a recess for receiving the semiconductor structure, the frame comprising first and second solder pads within the recess and connected to first and second vias for connection to an external electrical circuit, the first and second solder pads being soldered to the first and second electrical contacts of the semiconductor structure respectively; and a heat sink attached to the second surface of the semiconductor structure, wherein the heat sink is directly bonded to the second surface by thermal interface material.

For a number of semiconductor device applications there is a requirement for high power chips. Such high power chips suffer from heating issues. Degradation of components due to repeated heat cycling and damage to components due to overheating may lead to restriction of the functional life of a chip. Inefficient heat management will lead to chips operating at higher temperatures where the efficiency is lower.

In conventional devices the chip and packaging are interconnected by wire bonding. In particular, conventional lateral and vertical chips all use one or more bond wires for connection. This requires many individual metal wires, generally gold, silver, copper, or aluminium, to be attached to both the chip and packaging. This process requires precision to accurately bond the materials. Additionally, there are well known drawbacks associated with the common materials and techniques used.

Copper wire is the preferred material due to its relative cost and its favourable, low electrical resistance. However, it is harder than both gold and aluminium, restricting bonding parameters, and oxides are inherently formed leading to shelf life issues.

For high power devices where the current consumption is high (Amps) the number of bond wires required to carry the current is increased. This increases the complexity of the wire bonding step, slowing the process and increasing the cost. It is also necessary to increase the bond pad area to accommodate the greater number of bond wires.

JPH09199629 relates to a ceramic Ball Grid Array package which is required to be mounted with a thin type high power consumption element.

U.S. Pat. No. 5,701,033 relates to a semiconductor device comprising a substrate having a hollow cavity for mounting a semiconductor element therein and a lowered step surface at a periphery of the cavity for mounting a chip component thereon.

U.S. Pat. No. 8,564,114 relates to semiconductor package thermal tape window frame for heat sink attachment.

U.S. Pat. No. 5,831,825 relates to integrated circuit IC package and a process for cooling an integrated circuit mounted in an IC package.

US2010/0290193 relates to stacked-chip packaging structure and fabrication method thereof.

U.S. Pat. No. 6,483,186 relates to high power monolithic microwave integrated circuit package.

US 2010/0055845 relates to a power semiconductor module and a method of manufacture thereof includes lead a frame carrying lead having inner and outer lead portions.

US 2013/0069218 relates to high density package interconnect with copper heat spreader and method of making the same.

Accordingly, it is desirable to provide an improved semiconductor device package and method of manufacture and/or tackle at least some of the problems associated with the prior art or, at least, to provide a commercially useful alternative thereto.

The following description uses the term semiconductor device to refer to refer to the composite product comprising the semiconductor structure, the heat-sink and the frame discussed herein. The device is preferably a so-called power device, meaning that the device typically passes enough current in use that it produces undesirable levels of heat and therefore requires the heat-sink. Typical power devices have a thermal design power (TDP) of at least 1 W, preferably 5 to 100 W and more preferably 10 to 20 W.

The following description uses the term semiconductor structure to refer to the semiconductor structure which, when electrical contacts are present and a potential difference is applied, acts as an electrical device. Well known examples of such structures are diodes, transistors or thyristors. The semiconductor structure is sometimes referred to herein as the semiconductor chip.

The following description uses the term semiconductor package to refer to the combination of the semiconductor structure and the frame, but not including the heat-sink to which the package is attached to form the device.

The term "surface" when used in reference to the semiconductor structure or chip having a lateral structure refers to the generally planar portions of the chip perpendicular to the direction of the layers. The term side when used in reference to a lateral structure or chip refers to those faces of the structure or chip on which the layered structure is exposed.

The semiconductor package as described herein does not contain any bond wires and allows direct connection to a heat sink, improving heat dissipation which may improve life expectancy. The package is for connection to a heat-sink by a chip-direct connection using a thermal interface material.

Preferably, the package does not contain any bond wires or redistribution layers or the equivalent structures. That is, the chip is connected directly to the package without the need for additional electrical connections.

In particular, the inventors have found that the device is particularly advantageous because it is simpler and cheaper to produce due to the elimination of the wire bonding steps. Additionally, the elimination of the bond wires enables the device to be driven at higher current levels. The vias within the package may be made thicker than a conventional bond wire so as to have a low resistance. The improved heat dissipation of the device allows a higher current without increasing the temperature of the semiconductor structure. Whereas bond wires may have a cross-section as low as 15 microns, preferably the vias have a cross-section of at least 50 microns, preferably 100 to 200 microns.

The semiconductor structure described herein has a first surface and an opposite second surface. The semiconductor structure comprises a plurality of semiconductor layers as necessary to provide the device type, such as a diode. Suitable structures are well known in the art.

Conventional semiconductor structures such as diodes typically have a metal substrate layer in order to give good rigidity to the final device. Preferably the semiconductor device described herein does not comprise a metal support substrate because this reduces the number of layers in the stack and improves the thermal contact between the structure and the heat-sink.

The first surface further comprises first and second electrical contacts.

The device includes a frame having a recess for receiving the semiconductor structure. The frame described herein may be formed of any suitable, electrically insulating material. The present inventors have found that the frame can be made of any material through which an electrical circuit can be formed, such as ceramics, PCB, flex circuit, and Through Silicon Via (TSV) materials. Ceramic frames are particularly suitable. Such materials may be precisely shaped and offer advantageously high electrical resistance whilst being light and relatively low cost.

Preferably the frame does not overlap the second surface. That is, preferably the second surface of the LED structure is exposed, preferably the second surface is completely exposed.

Preferably the package does not contain any thermal vias. Advantageously, the package allows for direct bonding of the second surface of the chip to a heat sink, eliminating the need for thermal vias. Thermal vias are common in conventional LED packages. Where electrical vias are present to provide a path for electrical flow through a package, thermal vias are present to provide a path for heat flow through a package.

The frame comprises first and second solder pads within the recess and connected to first and second vias for connection to an external electrical circuit. That is, the frame contains two electrically isolated vias for connecting to the first and second contacts of the structure. The vias are connectable at a first end to the structure and at a second remote end to an electrical circuit, such as by solder connections.

The first and second solder pads are soldered to the first and second electrical contacts of the semiconductor structure respectively. This ensures an efficient electrical connection.

Preferably substantially the entire first surface of the semiconductor structure contacts the frame. Preferably the second surface is not attached to or overlapped by the frame. That is, preferably the second surface is exposed.

The device includes a heat sink attached to the second surface of the semiconductor structure, wherein the heat sink is directly bonded to the second surface by thermal interface material. Preferably the heat-sink comprises copper and/or aluminium.

Preferably the thermal interface material is a thermal interface grease, a thermal interface tape or a thermal interface compound. Thermal interface materials are well known in the art. Preferably the frame is, in addition to the adhesive and solder bonds, mechanically attached to the heat-sink, such as by a snap-fit clip or the like.

Preferably substantially the entire second surface of the semiconductor structure contacts the heat sink via the thermal interface material.

A heatsink is a passive heat exchanger that transfers the heat generated by an electronic or a mechanical device to a fluid medium, often air or a liquid coolant, where it is dissipated away from the device, thereby allowing regulation of the device's temperature at optimal levels. The heatsink is not an electrically active portion of a device or system. Preferred heatsinks include copper and/or aluminium. Copper is used because it has many desirable properties for thermally efficient and durable heat exchangers. First and foremost, copper is an excellent conductor of heat. This means that copper's high thermal conductivity allows heat to pass through it quickly. Aluminium is used in applications where weight is a big concern.

The bonding of the package to the heatsink may use a thermal interface material as an adhesive. Thermal adhesive or thermal grease improve the heat sink's performance by filling air gaps between the heat sink and the heat spreader on the device. Preferred compounds include thermal interface materials comprising nanoparticles which improve the thermal conductance.

Nominally flat surfaces of heat sinks and electrical components may appear rough at a microscopic level. This means that there are air gaps between the surfaces that have a high thermal resistance. Thermal interface materials such as greases and conductive particle-filled epoxies have been developed to address this problem. More recently, carbon nanotube arrays (CNTs) have been developed as a more efficient TIM. Current research has also incorporated nanoparticles in thermal interface materials as they offer improved (low) thermal interface resistance in addition to the bulk conductivity of many known materials.

The structure described herein may have a thermal resistance of less than 5° C./W, preferably less than 3° C./W, more preferably less than 1.6° C./W and most preferably less than 0.7° C./W. This resistance is so low because the use of the frame permits the direct contact of the structure with a heat sink for heat release to the ambient environment.

That is, the frame does not cover or overlap the second surface of the semiconductor structure and preferably the package is directly attached to the heat sink via the exposed second surface of the semiconductor structure. As discussed above, minimising the number of layers (thermal stack) between the semiconductor structure and the heat sink improves heat release from the semiconductor structure.

The frame may comprise an upper and a lower layer. The upper layer may be adjacent to and cover the first surface of the structure. The lower layer may substantially surround the body of the structure forming the recess.

The inventors have found that using a semiconductor structure with chamfered edges is particularly preferable for accurately and securely housing the semiconductor structure.

The present inventors have found that the package described herein has improved thermal resistance with respect to conventional packages. The package described herein is bonded directly to a heat-sink increasing heat dissipation from the package.

As with the LED package described above, while the device described herein is referred to as having first and second contacts, suitable devices may have more than two contacts, such as a plurality of contacts.

Accordingly, in a preferred embodiment there is provided a semiconductor device comprising:

a semiconductor structure having a first surface and an opposite second surface, the semiconductor structure comprising a plurality of semiconductor layers, the first surface further comprising at least first and second electrical contacts;

a frame having a recess for receiving the semiconductor structure, the frame comprising at least first and second solder pads within the recess, each solder pad connected to a via for connection to an external electrical circuit, each solder pad being soldered to one of said electrical contacts of the semiconductor structure; and a heat sink attached to the second surface of the semiconductor structure, wherein the heat sink is directly bonded to the second surface by thermal interface material.

In another aspect the present disclosure provides a method for the manufacture of a semiconductor device, the method comprising:

providing a semiconductor structure having a first surface and an opposite second surface, the semiconductor structure comprising a plurality of semiconductor layers, the first surface further comprising first and second electrical contacts;

providing a frame having a recess for receiving the semiconductor structure, the frame comprising first and second solder pads within the recess and connected to first and second vias for connection to an external electrical circuit;

providing a heat sink, introducing the semiconductor structure into the recess, whereby the first and second solder pads align with the first and second contacts of the semiconductor structure respectively;

connecting the first and second solder pads to the first and second contacts respectively;

bonding the second surface of the semiconductor structure to the heat-sink with a thermal interface material.

The method described herein is suitable for producing the semiconductor device of the present disclosure.

Preferably, after the structure is introduced into the recess, bonding material is filled into the recess, around the structure, to retain the structure in the recess.

Preferably the structure has one or more chamfered sides to thereby aid retention by the bonding material.

The features of heat sinks and thermal interface materials discussed in relation to the LED package apply equally to heat sinks and thermal interface materials used in the semiconductor structure package disclosed herein.

The invention will now be described in relation to the following non-limiting figures. Further advantages of the disclosure are apparent by reference to the detailed description when considered in conjunction with the figures, which are not to scale so as to more clearly show the details, wherein like reference numbers indicate like elements throughout the several views. FIGS. 2 to 5 relate to the exemplary LED package of the present invention, whereas FIGS. 7 to 8 relate to the semiconductor package which is also described herein.

The attached figures use like reference numerals for similar features, with the first number indicating the figure number. Therefore, 1100 and 2100 refer to similar features in FIGS. 1 and 2 respectively.

FIG. 1 shows a pair of conventional high-power LED packages (1000, 1005). The LED packages (1000, 1005) are each provided mounted with an epoxy on a ceramic base (1010). The mounting could, alternatively, be with solder. Each comprise an LED structure (1015) mounted on the ceramic base (1010). The LED structure (1015) is substantially covered by a phosphor layer (1020), onto which a zener die attach (1025) is mounted. Bond wires (1030) complete the circuit and the entire structure is covered by a shell or lens (1035).

Figure 2:
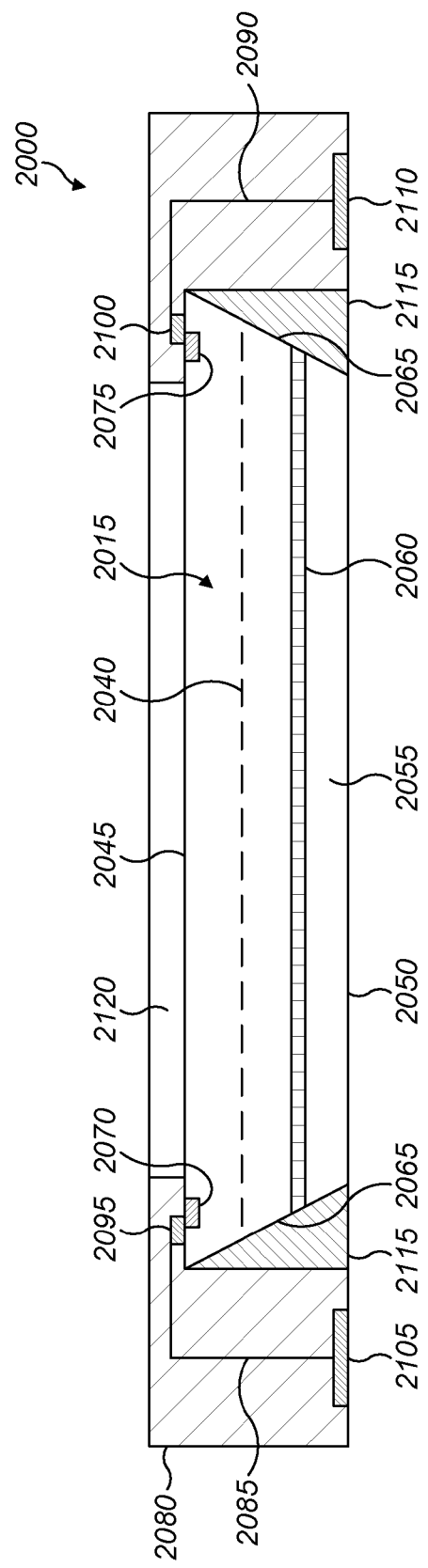
FIG. 2 shows an exemplary LED package of the present invention.

FIG. 2 shows an exemplary LED package (2000) according to the invention. The LED package (2000) comprises an LED structure (2015). The LED structure (2015) has a conventional LED form. This includes a light-producing layer (2040) formed at the interface of a p-doped and an n-doped layer (not shown). The upper, first surface (2045) is a light-emitting first surface of the LED structure. The lower, second surface (2050) is the supporting substrate (2055), such as a silicon substrate which has good thermal conductivity. Between the substrate (2055) and the light-producing layer (2040), there is provided a reflective layer (2060), which can be formed of a metal-containing adhesive.

The LED structure (2015) has chamfered edges (2065) around the periphery.

The LED structure also includes first and second contacts (2070, 2075) which are provided in a conventional manner for such a lateral LED structure.

FIG. 2 also includes a frame (2080) attached to the LED structure (2015). The frame (2080) includes first and second vias (2085, 2090) for connecting first and second bond pads (2095, 2100) to external first and second contact pads (2105, 2110). The frame (2080) may be made of a ceramic, while the first and second vias (2085, 2090) are made of any conductive material.

The frame of the ceramic version is typically 3.5 mm×3.5 mm (termed a 3535 package). However, sizes ranging from 1.0 mm×1.0 mm to 10 mm×10 mm are contemplated. A PCB version could be multi or array of any size of chips which will determine a whole PCB version package size.

To form the LED package (2000), the first and second bond pads (2095,2100) are attached to the first and second contacts (2070,2075) respectively, such as by solder (not shown).

To aid retention of the LED structure (2015) in the frame (2080), a filler material (2115) can be introduced around the edges of the LED structure (2015). This holds the LED structure (2015) by trapping the chamfered edges (2065) against the frame (2080).

In use the LED package (2000) is connected to a heatsink (not shown) by the second surface (2050). At the same time, the first and second contact pads (2105, 2110) are connected to an external circuit (not shown).

A phosphor coating (2120) is provided on the first surface (2045), flush to an upper level of the frame (2080) and bounded by sides of the frame (2080). Secondary optics may be applied over the phosphor coating (not shown).

When an electrical circuit is completed, light is generated in the light-producing layer (2040). This may directly leave the first surface (2045), or be reflected to the first surface (2045) by the reflective layer (2060). Heat built up in the LED package (2000) passes readily to the heatsink due to the high thermal conductivity and the minimal number of intervening layers.

Figure 3:
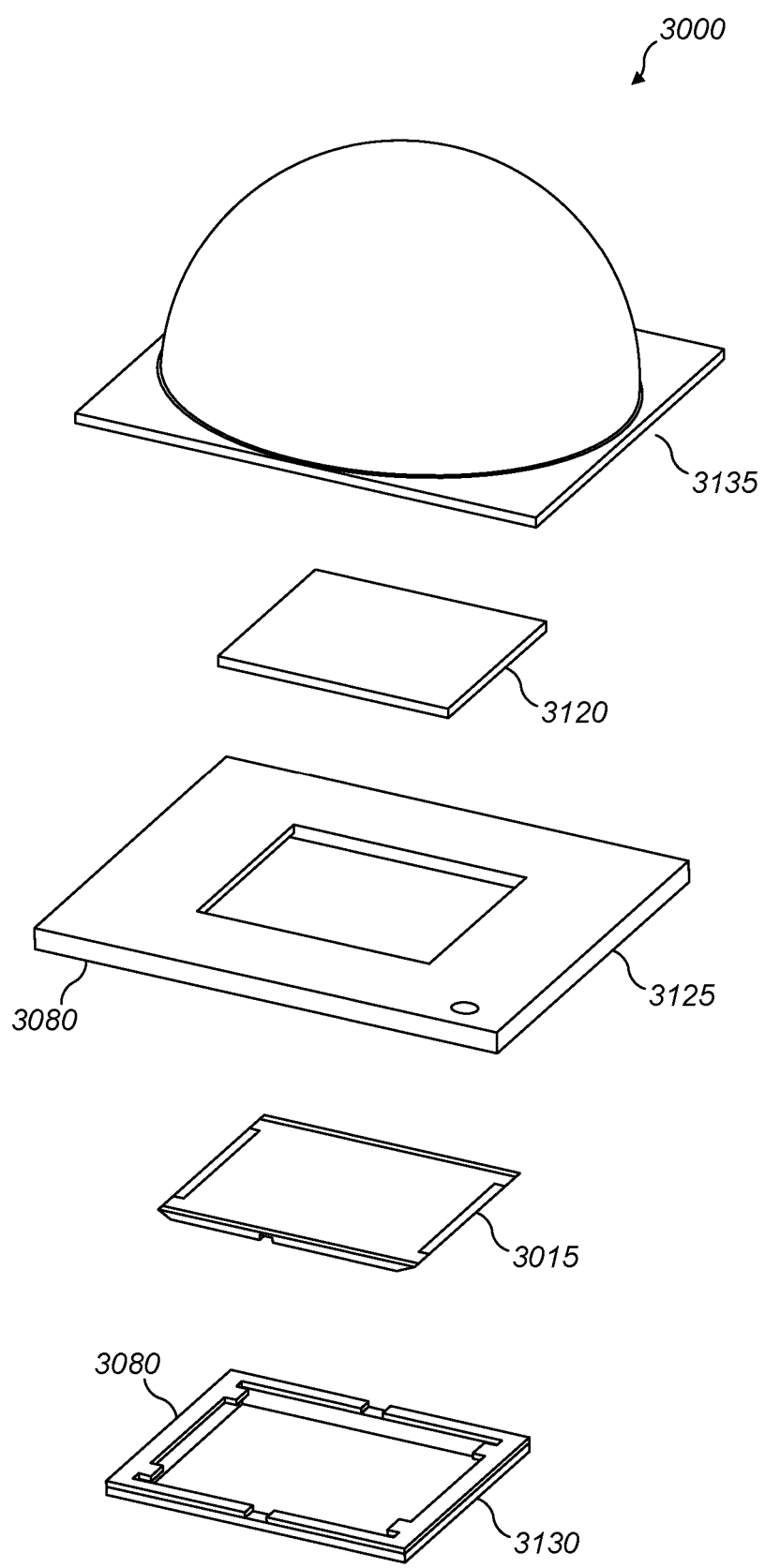
FIG. 3 shows the components of an exemplary LED package of the present invention, including a lens and a two-part frame comprising upper and lower layers.

FIG. 3 shows a schematic of the key components of an LED package (3000). This includes an LED structure (3015) and a frame (3080) having an upper layer (3125) and a lower layer (3130) bonded together with bonding material (not shown). The LED package (3000) also includes a phosphor layer (3120) and a lens (3135).

Figure 4:
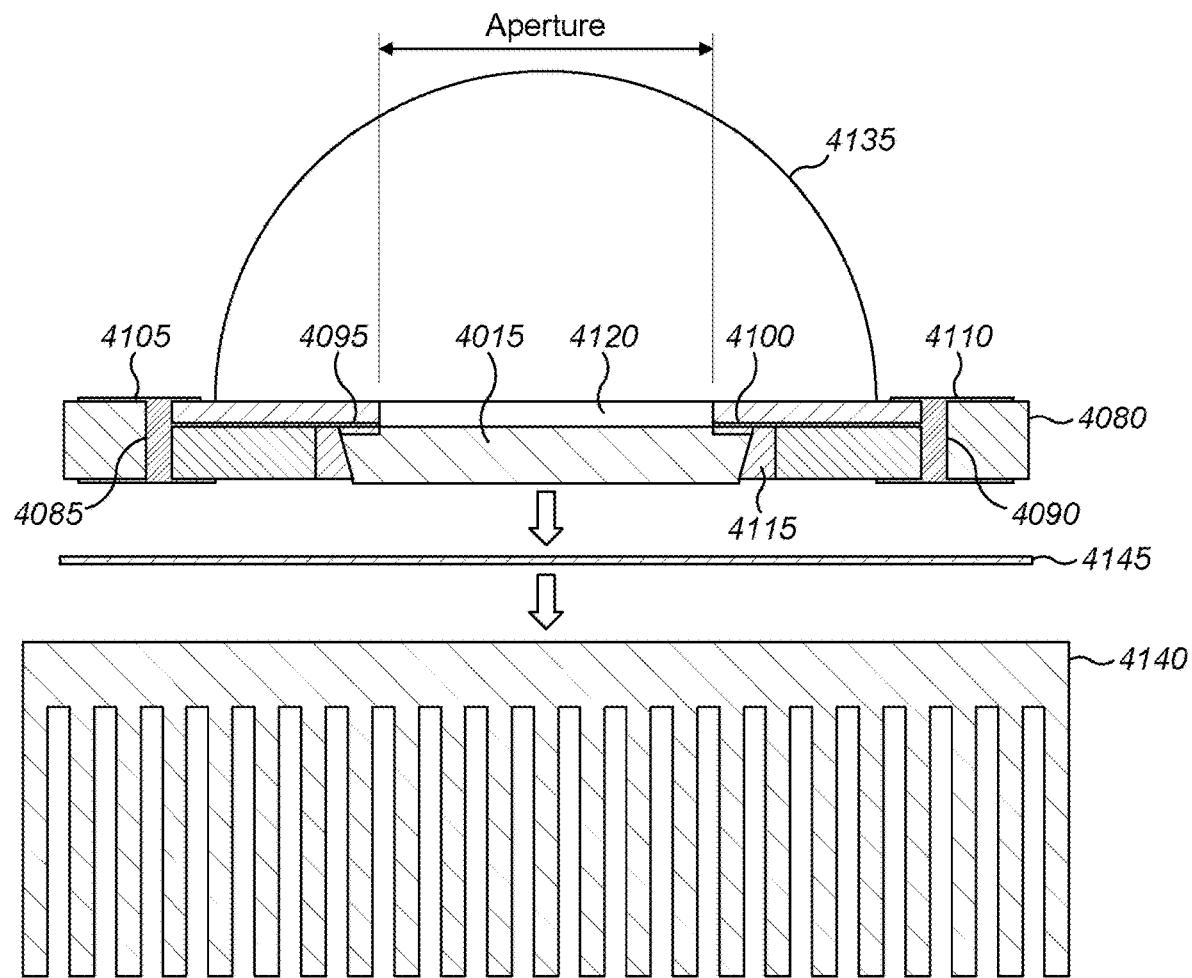
FIG. 4 shows an exemplary LED package of the present invention using a ceramic/TSV frame.

FIG. 4 shows a structure with a ceramic frame 4080 for adhering an LED structure 4015 to a heatsink 4140 with a thermal interface material 4145 (TIM).

Figure 5:
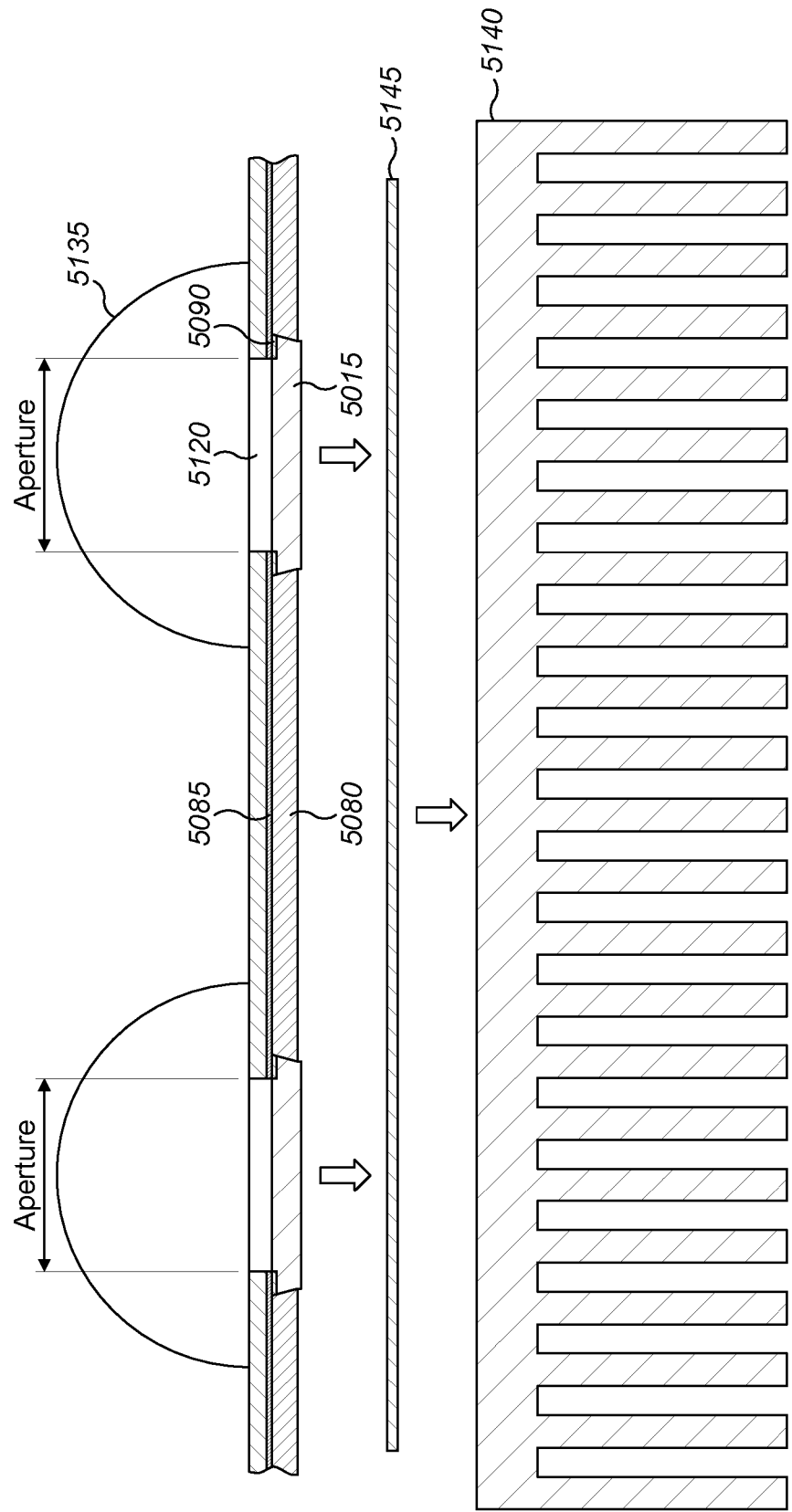
FIG. 5 shows an exemplary LED package of the present invention using a PCB frame.

FIG. 5 shows a structure with multiple LED structures 5015 in a PCB frame 5080 for adhering the LED structures 5015 to a heatsink 5140 with a thermal interface material 5145 (TIM).

Figure 6:
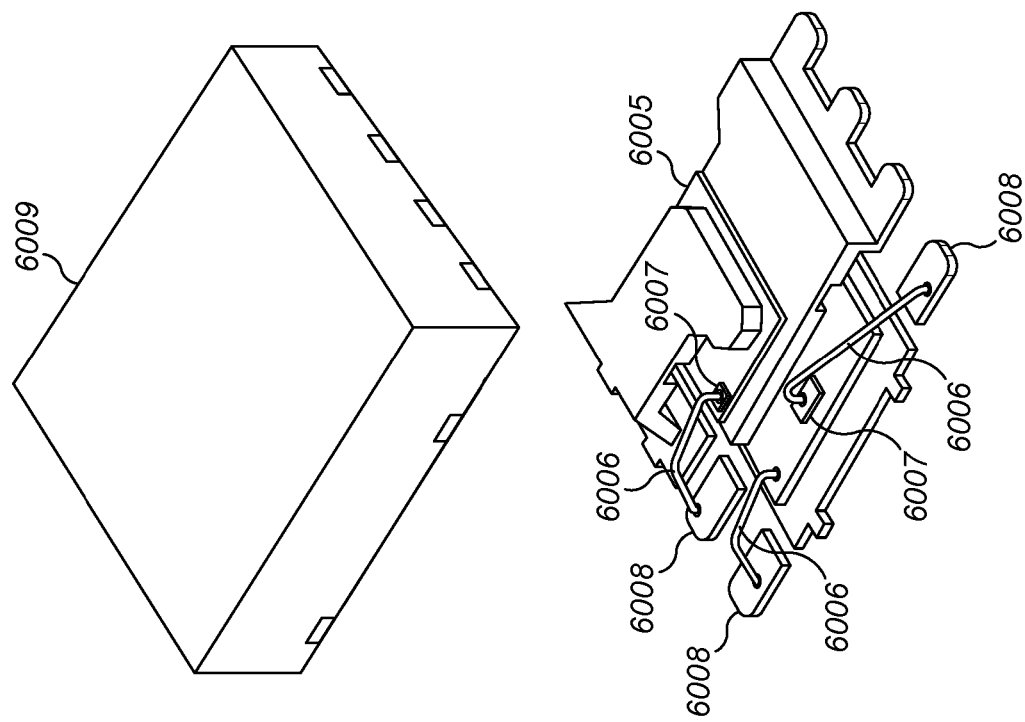
FIG. 6 shows a conventional vertical semiconductor device known in the art.
Figure 6:
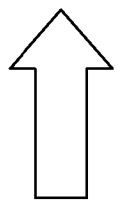
Figure 6:
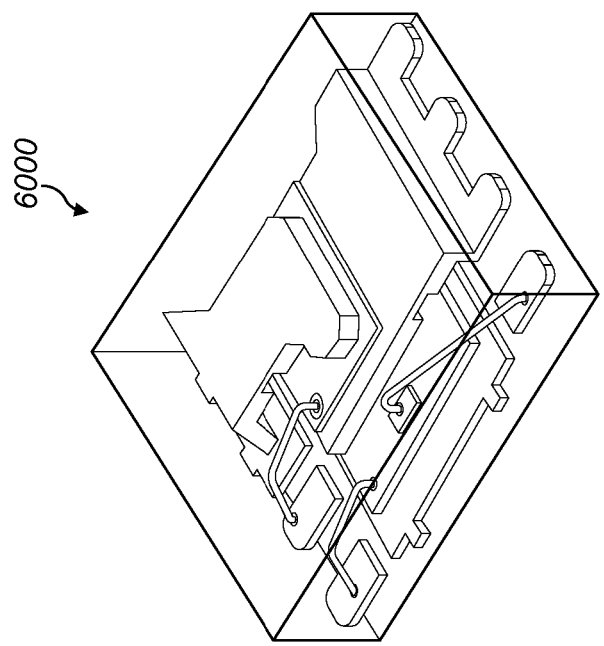

FIG. 6 shows a conventional semiconductor device (6000). The semiconductor device includes a semiconductor structure (6005) comprising two stacked field effect transistors with wire bond (6006) connections between solder pads (6007) on the semiconductor structure (6005) and surface electrical contacts (6008). A case (6009) is shown enclosing the structure (6005).

Figure 7:
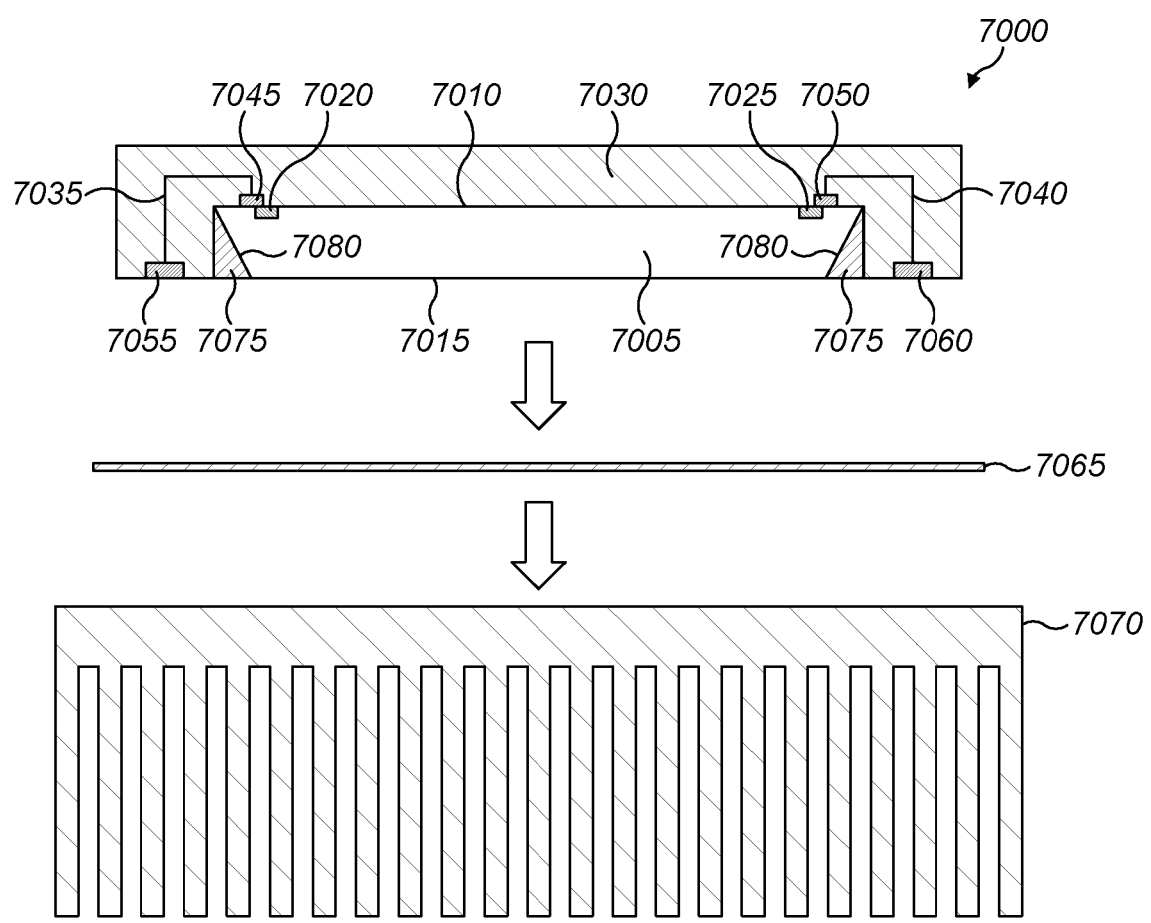
FIG. 7 shows the components of an exemplary semiconductor device, including the thermal interface material and heatsink.

FIG. 7 shows an exploded view of an exemplary semiconductor device (7000). The semiconductor device (7000) comprises a semiconductor structure (7005). The semiconductor structure (7005) may be any conventional semiconductor structure such as a diode. The semiconductor structure (7005) has a first surface (7010) and a second opposite surface (7015) and a plurality of semiconductor layers (not shown) therebetween. There is no metal substrate layer provided on the second surface (7015).

The first surface (7010) of the semiconductor structure (7005) comprises first and second electrical contacts (7020, 7025).

FIG. 7 also includes a frame (7030) attached to the semiconductor structure (7005). The frame (7030) includes first and second vias (7035, 7040) for connecting first and second bond pads (7045, 7050) to external first and second contact pads (7055, 7060). The frame (7030) may be made of a ceramic, while the first and second vias (7035, 7040) are made of any conductive material.

Figure 8A:
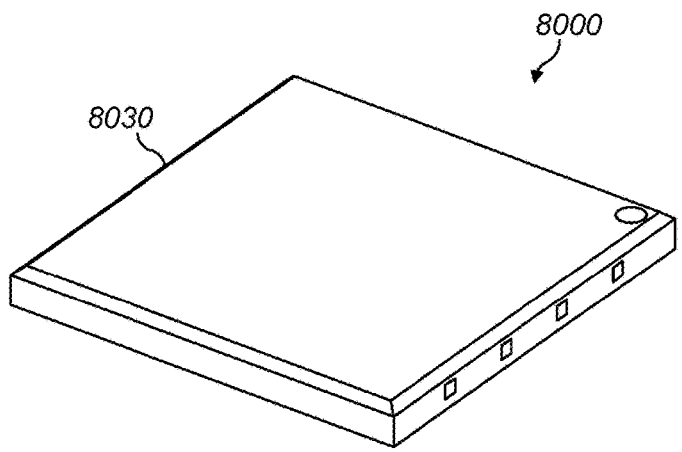
FIG. 8a shows a top view of an exemplary semiconductor package and frame.
Figure 8B:
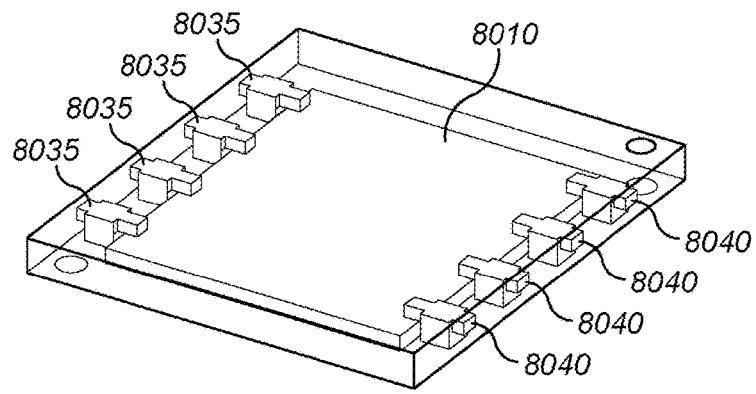
FIG. 8b shows a top view of an exemplary semiconductor package and frame where the frame is shown as translucent in order to show the interior structure.
Figure 8C:
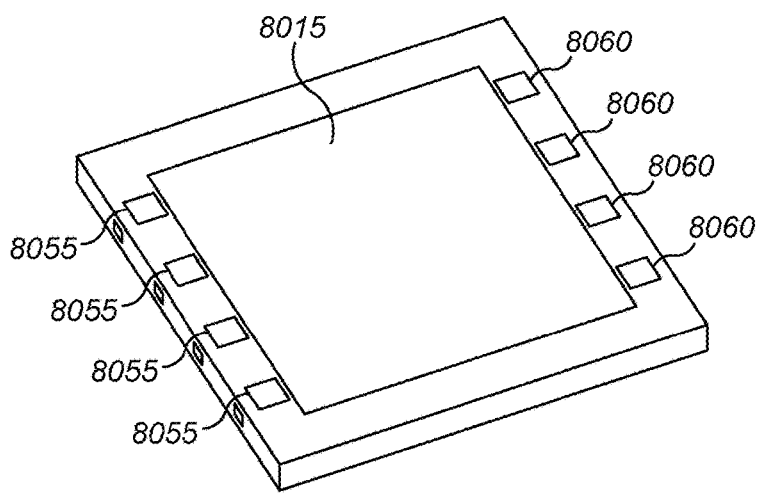
FIG. 8c shows a bottom view of an exemplary semiconductor package and frame.

FIG. 8 further includes a layer of thermal interface material (7065) and a heatsink (7070).

To form the semiconductor device (7000), the first and second bond pads (7045, 7050) are attached to the first and second electrical contacts (7020, 7025) respectively, such as by solder (not shown) and the heatsink is bonded to the second surface (7015) of the semiconductor structure (2005) by the thermal interface material (7065).

The frame of the ceramic version is typically 3.5 mm×3.5 mm (termed a 8535 package). However, sizes ranging from 1.0 mm×1.0 mm to 10 mm×10 mm are contemplated. The frame may contain a plurality of recesses for holding a plurality of semiconductor structure.

To aid retention of the semiconductor structure (7005) in the frame (7030), a filler material (7075) can be introduced around the edges of the semiconductor structure (7005). This holds the semiconductor structure (7005) by trapping chamfered edges (7080) of the semiconductor structure (7005) against the frame (7030).

In use the first and second contact pads (7055, 7060) are connected to an external circuit (not shown).

Heat built up in the semiconductor structure (7005) in use passes readily to the heatsink due to the high thermal conductivity and the minimal number of intervening layers.

Although preferred embodiments of the invention have been described herein in detail, it will be understood by those skilled in the art that variations may be made thereto without departing from the scope of the invention or of the appended claims.

The invention claimed is:

1. An LED device comprising an LED package for connection to a heat sink, the LED package comprising:
    an LED structure having a first surface for emitting light and an opposite second surface, the LED structure comprising a light producing layer and a reflective layer, wherein the reflective layer is provided between the light producing layer and the second surface, whereby light is reflected by the reflective layer to the first surface, the first surface further comprising first and second electrical contacts; and
    a frame overlapping the periphery of the first surface of the LED structure and having an aperture for emitting light from the first surface and having a recess for receiving the LED structure, the frame comprising first and second vias for connection to an external electrical circuit, the first via having a first bond pad and the second via having a second bond pad, wherein the first and second bond pads are soldered to the first and second electrical contacts of the LED structure respectively;
    wherein the frame does not overlap the second surface of the LED structure;
    wherein the LED structure has one or more chamfered sides and is bonded into the recess in the frame with a bonding material applied around the LED structure; and
    wherein the second surface is in direct contact with a heatsink or is directly bonded to a heatsink with a thermal interface material.

2. The LED device according to claim 1, wherein the LED structure is a lateral LED structure.

3. The LED device according to claim 1, wherein the LED structure further comprises a silicon substrate forming the second surface.

4. The LED device according to claim 1, wherein the LED package has a thermal resistance of less than 5° C./W.

5. The LED device according to claim 1, wherein the frame is formed of a ceramic material, PCB or TSV.

6. The LED device according to claim 1, wherein the LED package further comprises a wavelength conversion material on the first surface of the LED structure and bounded by the frame aperture, wherein the wavelength conversion material substantially fills the frame aperture.

7. An LED device according to claim 1, further comprising a lens for focussing light emitted from the first surface of the LED structure.

8. The LED device according to claim 1, wherein the LED package has a thermal resistance of less than 1.6° C./W.

9. The LED device according to claim 1:
wherein the LED structure is a lateral LED structure;
wherein the LED structure further comprises a silicon substrate forming the second surface; and
wherein the LED package further comprises a wavelength conversion material on the first surface of the LED structure and bounded by the frame aperture.

10. The LED device according to claim 1:
wherein the LED structure is a lateral LED structure;
wherein the LED structure further comprises a silicon substrate forming the second surface; and
wherein the LED package further comprises a wavelength conversion material on the first surface of the LED structure and bounded by the frame aperture;
wherein the LED package has a thermal resistance of less than 1.6° C./W.

11. A method for the manufacture of an LED package, the method comprising:
providing an LED structure having a first surface for emitting light and an opposite second surface, the LED structure comprising a light producing layer and a reflective layer, wherein the reflective layer is provided between the light producing layer and the second surface, whereby light is reflected by the reflective layer to the first surface, the first surface further comprising first and second electrical contacts;
providing a frame having an aperture and, on one face, a recess for receiving the LED structure, the frame comprising a first via having a first bond pad and a second via having a second bond pad, wherein the first and second bond pads are for connection to an external electrical circuit;
introducing the LED structure into the frame, whereby the frame overlaps the periphery of the first surface of the LED structure and provides an aperture for emitting light from the first surface, and whereby the first bond pad of the first via and the second bond pad of the second via align with the first and second contacts of the LED structure respectively;
connecting the first and second vias to the first and second contacts respectively;
bonding the LED structure into the recess in the frame with a bonding material applied around the LED structure;
directly contacting a heatsink to the second surface of the LED structure or directly bonding a heatsink to the second surface of the LED structure with a thermal interface material;
wherein the LED structure has one or more chamfered sides to thereby aid retention by the bonding material.

* * * * *